United States Patent
Aida et al.

(10) Patent No.: US 8,658,890 B2
(45) Date of Patent: Feb. 25, 2014

(54) SOLAR CELL AND METHOD OF MANUFACTURING SOLAR CELL

(75) Inventors: Yasuhiro Aida, Tokyo (JP); Masato Susukida, Tokyo (JP)

(73) Assignee: TDK Corporation, Tokyo (JP)

( * ) Notice: Subject to any disclaimer, the term of this patent is extended or adjusted under 35 U.S.C. 154(b) by 251 days.

(21) Appl. No.: 12/704,413

(22) Filed: Feb. 11, 2010

(65) Prior Publication Data

US 2010/0206381 A1 Aug. 19, 2010

(30) Foreign Application Priority Data

Feb. 18, 2009 (JP) .............................. P2009-035594

(51) Int. Cl.
*H01L 31/00* (2006.01)
*H01L 21/00* (2006.01)

(52) U.S. Cl.
USPC ........... 136/265; 136/252; 136/255; 136/262; 136/264; 438/85; 438/93; 438/95

(58) Field of Classification Search
USPC ................. 136/252, 261–262, 264–265, 255; 438/85, 93, 95
See application file for complete search history.

(56) References Cited

U.S. PATENT DOCUMENTS

| 6,259,016 B1 * | 7/2001 | Negami et al. ................. 136/265 |
| 2006/0180200 A1 | 8/2006 | Bjorkman et al. | |

FOREIGN PATENT DOCUMENTS

| JP | B2 3249342 | 1/2002 |
| JP | B2 3337494 | 10/2002 |
| JP | B2 3434259 | 8/2003 |
| JP | B2 3468328 | 11/2003 |
| JP | A 2004-47916 | 2/2004 |
| JP | B2 3837114 | 10/2006 |
| JP | A 2006-525671 | 11/2006 |
| WO | WO 2008073469 A1 * | 6/2008 |

OTHER PUBLICATIONS

Chaparro et al. "Characterization of CuInS2/Zn(Se,O)/ZnO solar cells as a function of Zn(Se,O) buffer deposition kinetics in a chemical bath." Progress in Photovoltaics:Research and Applications. 2002. 10:465-480.*

Ennaoui et al. "High-efficiency Cd-free CIGSS thin-film solar cells with solution grown zinc compound buffer layers." Solar Energy Materials & Solar Cells 67 (2001) 31-40.*

Minemoto et al., "Theoretical analysis of the effect of conduction band offset of window/CIS layers on performance of CIS solar cells using device simulation," *Solar Energy Materials & Solar Cells*, vol. 67, 2001, pp. 83-88.

Repins et al., "19.9%-efficient ZnO/CdS/CuInGaSe2 Solar Cell with 81.2% Fill Factor," *Prog. Phoiovolt.: Res. Appl.*, vol. 16, 2008, pp. 235-239.

* cited by examiner

*Primary Examiner* — Jonathan Johnson
*Assistant Examiner* — Lindsey Bernier
(74) *Attorney, Agent, or Firm* — Oliff PLC

(57) ABSTRACT

A solar cell which can increase its open-circuit voltage, short-circuit current, and fill factor (F.F.), thereby enhancing its conversion efficiency is provided. The solar cell of the present invention comprises a p-type semiconductor layer and an n-type semiconductor layer, formed on the p-type semiconductor layer, containing a compound expressed by the following chemical formula (1):

$$ZnO_{1-x-y}S_xSe_y \qquad (1)$$

where $x \geq 0$, $y > 0$, and $0.2 < x+y < 0.65$.

5 Claims, 3 Drawing Sheets

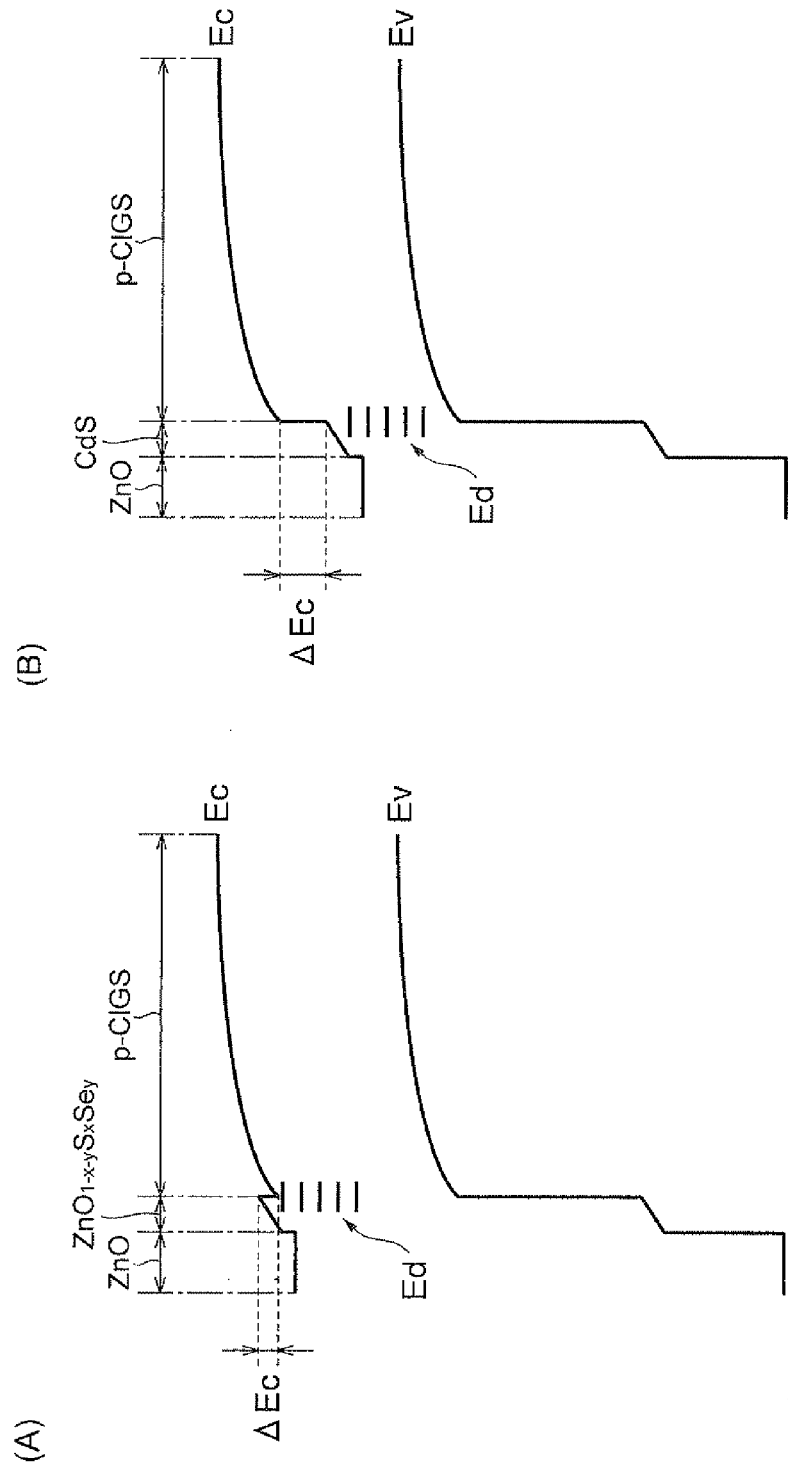

SOLAR CELL AND METHOD OF MANUFACTURING SOLAR CELL

BACKGROUND OF THE INVENTION

1. Field of the Invention

The present invention relates to a solar cell and a method of manufacturing a solar cell.

2. Related Background Art

In place of bulk crystalline silicon solar cells which have been coming into wider use, thin-film solar cells using thin-film semiconductor layers as photo-absorber have been under development. Among them, thin-film solar cells employing p-type compound semiconductor layers containing Ib, IIIb, and VIb group elements as their photo-absorbing layers are expected to be next-generation solar cells, since they exhibit high energy conversion efficiencies and are less likely to be deteriorated by light (see Japanese Patent Publication Nos. 3249342, 3837114, and 3434259, Japanese Translated International Patent Application Laid-Open No. 2006-525671, Japanese Patent Publication Nos. 3468328 and 3337494, Japanese Patent Application Laid-Open No. 2004-047916, and Solar Energy Materials and Solar Cells 67 (2001 ):83 -88). Specifically, thin-film solar cells using $CuInSe_2$ (hereinafter referred to as "CIS") constituted by Cu, In, and Se or $Cu(In_{1-a}, Ga_a)Se_2$ (hereinafter referred to as "CIGS") partly replacing In, which is a IIIb group element in CIS, with Ga as their photo-absorbing layers have yielded high conversion efficiencies (see Prog. Photovolt: Res. Appl. (2008), 16:235-239).

SUMMARY OF THE INVENTION

In general, a thin-film solar cell comprising a p-type semiconductor layer constituted by CIGS (hereinafter referred to as "p-CIGS layer") as its photo-absorbing layer (hereinafter referred to as "CIGS solar cell") has a structure in which a molybdenum rear electrode (positive electrode), a p-CIGS layer, an n-type buffer layer (n-type semiconductor layer), a semi-insulating layer, a transparent conductive layer, and a lead electrode (negative electrode) are sequentially laminated on a soda-lime glass sheet acting as a base. The conversion efficiency η of such a CIGS solar cell is represented by the following expression (A):

$$\eta = V_{OC} \cdot I_{SC} \cdot F.F./P_{in} \times 100 \quad (A)$$

where $V_{OC}$ is the open-circuit voltage, $I_{sc}$ is the short-circuit current, F.F. is the fill factor, and $P_{in}$ is the incident power density.

As can be seen from the above-mentioned expression (A), the conversion efficiency will improve if any of the open-circuit voltage, short-circuit current, and fill factor can be enhanced. In general, the open-circuit voltage in a p-n junction solar cell tends to become higher as the p-type photo-absorbing layer and n-type buffer layer increase their bandgaps (Eg). On the other hand, the short-circuit current is mainly determined by the quantum efficiency of the p-type photo-absorbing layer. As the Eg of the p-type photo-absorbing layer is lower, light having a longer wavelength is absorbed thereby, whereby the short-circuit current tends to increase. Thus, there are trade-offs between the open-circuit voltage and short-circuit current. The optimal value of Eg in the p-type photo-absorbing layer for satisfying both of them has been considered to be 1.4 to 1.5 eV in view of a correlation with a solar spectrum. It is therefore desirable that the Eg of the p-type photo-absorbing layer be controlled such as to fall within the range of 1.4 to 1.5 eV.

The Eg of the p-CIGS layer can be controlled by modulating the molar ratio between In and Ga which are IIIb group elements. For example, modulating "a" from 0 to 1 in $Cu(In_{1-a}, Ga_a)Se_2$ can enhance the Eg from 1.04 eV to 1.68 eV. In order for the Eg of the p-CIGS layer to attain its optimal value of 1.4 to 1.5 eV, it will be sufficient if "a" falls within the range of 0.5 to 0.8.

However, the p-CIGS layer currently achieving the highest conversion efficiency has an "a" of 0.2 to 0.3, i.e., a molar ratio Ga/(In +Ga) of 0.2 to 0.3, thereby yielding an Eg of 1.2 to 1.3 eV. This leaves room for raising the Eg to its optimal value of 1.4 to 1.5 eV in order to enhance the conversion efficiency of the solar cell. Increasing the Ga/(In +Ga) to raise the Eg, however, enhances the reverse saturation current, so as to reduce the open-circuit voltage, thereby lowering the conversion efficiency. One of its causes has been reported to be an increase in the difference between the energy level in the bottom part of the conduction band (hereinafter referred to as "CBM" (Conduction Band Minimum) of the p-type photo-absorbing layer and the CBM of the n-type buffer layer at their p-n junction interface (see Solar Energy Materials and Solar Cells 67 (2000:83-88). The value obtained by subtracting the CBM of the p-type photo-absorbing layer from the CBM of the n-type buffer layer at the p-n junction interface will be referred to as "CBM offset" hereinafter.

In general, a CIGS solar cell is equipped with an n-type buffer layer constituted by cadmium sulfide (CdS). Such a CIGS solar cell yields a negative CBM offset $\Delta E_c$ when Ga/(In +Ga) is set to 0.5 or greater in order for the p-CIGS layer to attain a wider gap as illustrated in FIG. 3B. That is, the CBM of the p-CIGS becomes greater than the CBM of the n-type buffer layer. In such a band structure, a greater number of carriers recombine through defect levels $E_d$ of the p-n junction interface, thereby lowering the open-circuit voltage very much. Hence, for inhibiting the open-circuit voltage from decreasing, it is necessary for the CBM of the p-CIGS layer and the CBM of the n-type buffer layer to match each other so as not to yield a negative CBM offset. On the other hand, the CBM offset acts as a barrier for photogenerated carriers when made positive. If this barrier is too high, the number of carriers that can be taken out decreases, thereby remarkably lowering the short-circuit current. The CBM offset that causes the short-circuit current to decrease is about +0.4 eV according to a simulation. Therefore, an appropriate CBM offset for satisfying both of the open-circuit voltage and short-circuit current ranges from 0 to about +0.4 eV.

In view of the foregoing, it is desirable to improve the conversion efficiency by achieving such a band alignment in both of the wide-gapped p-CIGS layer and the n-type buffer layer as to optimize their CBM. The inventors considered that the conversion efficiency could be improved by using an n-type buffer layer constituted by a material other than CdS. However, the inventors have found that the following problems may occur when conventionally known materials are used for the n-type buffer as materials other than CdS.

Japanese Patent Publication No. 3249342 proposes to form an n-type buffer layer constituted by Zn(S, O, OH) by using chemical bath deposition (CBD). In this case, the n-type buffer layer can be formed without using cadmium which is harmful to humans. Since the chemical bath deposition is used for forming the n-type buffer layer constituted by Zn(S, O, OH) as in the case of CdS, impurities are likely to mix into the n-type buffer layer, thereby making it hard to control the carrier density that is an important factor in device designing. It is difficult for the chemical bath deposition to control the molar ratio between S and O in the n-type buffer layer, whereby the CBM offset is hard to optimize. When forming the n-type buffer layer, the p-CIGS layer is exposed to air and a solution, so as to be oxidized or contaminated, whereby defects may occur in the vicinity of the p-n junction interface. A large amount of a chemical solution is necessary for a large-area device such as a solar cell, while the chemical solution used for forming the n-type buffer is not reusable, which requires an enormous cost for purchasing the chemical solution and disposing of the liquid waste.

Japanese Patent Publication No. 3837114 proposes an n-type buffer layer constituted by ZnMgO. The bandgap of ZnMgO can be controlled by the molar ratio Zn/Mg. Since MgO has a rock-salt structure, however, the crystallinity of the ZnMgO remarkably decreases as the ratio of Mg is enhanced in order to obtain an appropriate band alignment. Since MgO has a very high ion binding property, it is hard to control the carrier density by adding impurities to ZnMgO. Further, ZnMgO is highly deliquescent and chemically unstable, thereby being poor in reliability as a material for constructing the n-type buffer layer.

As in the foregoing, desirable solar cells have been hard to obtain even when materials other than CdS are used in n-type buffer layers. Therefore, a conversion efficiency exceeding that of a CIGS solar cell comprising an n-type buffer layer constituted by CdS has not been achieved.

In view of the problems of the prior art mentioned above, it is an object of the present invention to provide a solar cell which can increase the open-circuit voltage, short-circuit current, and fill factor (F.F.) as compared with the conventional solar cells, thereby enhancing the conversion efficiency, and a method of manufacturing the solar cell.

For achieving the above-mentioned object, the solar cell in accordance with the present invention comprises a p-type semiconductor layer and an n-type semiconductor layer, formed on the p-type semiconductor layer, containing a compound expressed by the following chemical formula (1):

$$ZnO_{1-x-y}S_xSe_y \quad (1)$$

where $x \geq 0$, $y > 0$, and $0.2 < x+y < 0.65$.

This solar cell can increase the open-circuit voltage, short-circuit current, and fill factor (F.F.) as compared with the conventional solar cells, thereby enhancing the conversion efficiency. The inventors consider that forming a p-n junction by using the n-type semiconductor layer having the above-mentioned composition and a p-type semiconductor layer achieves such a band alignment as to optimize the CBM offset, thereby yielding the advantageous effects of the present invention.

Preferably, in the present invention, the p-type semiconductor layer contains Cu, In, Ga, and Se. This makes the advantageous effects of the present invention remarkable.

A first method of manufacturing a solar cell in accordance with the present invention comprises the steps of forming a p-type semiconductor layer and forming an n-type semiconductor layer containing a compound expressed by the above-mentioned chemical formula (1) on the p-type semiconductor layer by vapor deposition in an atmosphere containing oxygen.

A second method of manufacturing a solar cell in accordance with the present invention comprises the steps of forming a p-type semiconductor layer and forming an n-type semiconductor layer containing a compound expressed by the above-mentioned chemical formula (1) on the p-type semiconductor layer by sputtering in an atmosphere containing oxygen.

A third method of manufacturing a solar cell in accordance with the present invention comprises the steps of forming a p-type semiconductor layer; forming a precursor layer containing Zn and Se and having an S content of 0 mol % or greater on the p-type semiconductor layer by sputtering; and heating the precursor layer in an atmosphere containing oxygen, so as to form an n-type semiconductor layer containing a compound expressed by the above-mentioned chemical formula (1) on the p-type semiconductor layer.

The above-mentioned first, second, and third methods can yield the solar cell in accordance with the present invention.

The present invention can provide a solar cell which can increase the open-circuit voltage, short-circuit current, and fill factor (F.F.) as compared with the conventional solar cells, thereby enhancing the conversion efficiency, and a method of manufacturing the solar cell.

BRIEF DESCRIPTION OF THE DRAWINGS

FIG. 3A is a schematic chart illustrating the band structure of the solar cell in accordance with an embodiment of the present invention. FIG. 3B is a schematic chart illustrating the band structure of the conventional solar cell equipped with an n-type buffer layer constituted by CdS.

DESCRIPTION OF THE PREFERRED EMBODIMENTS

Figure 1:
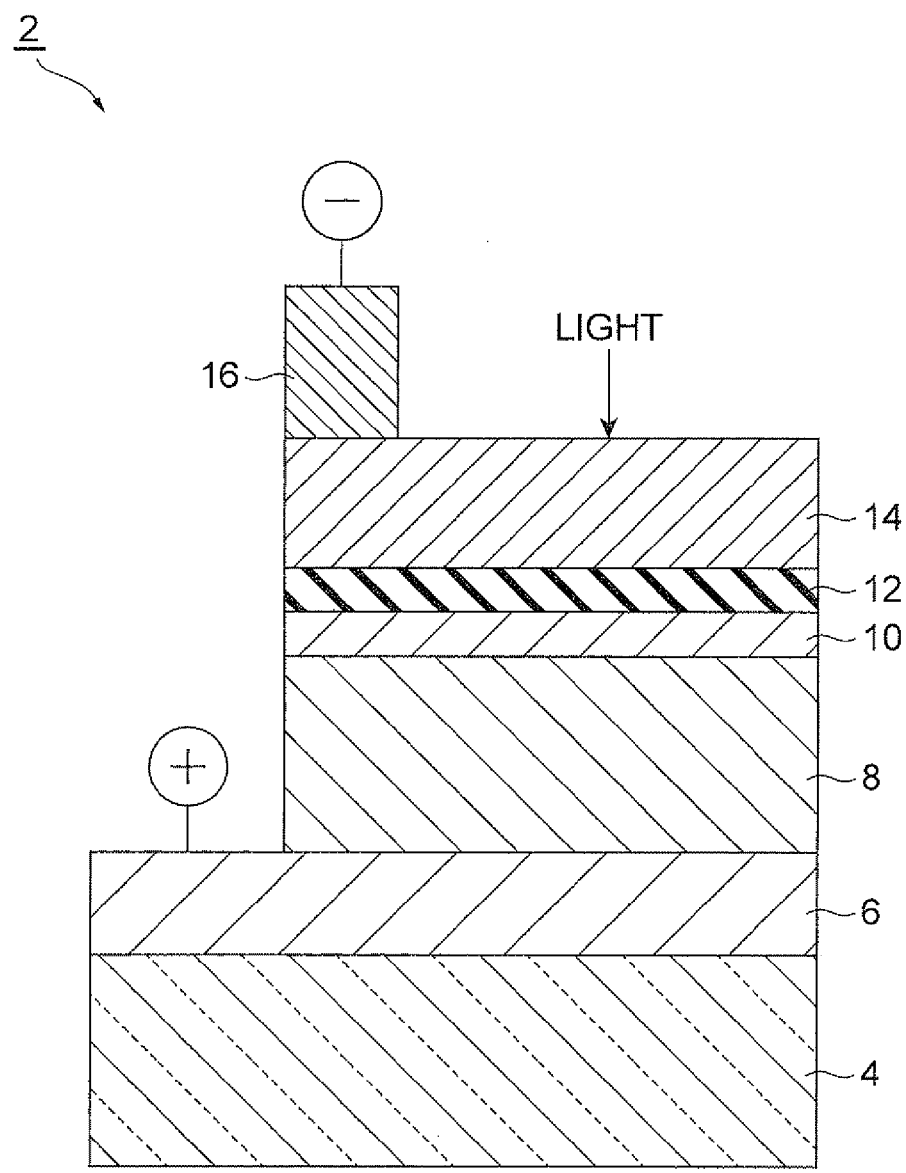
FIG. 1 is a schematic sectional view of the solar cell in accordance with an embodiment of the present invention.

In the following, a preferred embodiment of the present invention will be explained in detail with reference to the drawings. In the drawings, the same or equivalent constituents will be referred to with the same signs. Vertical and horizontal positional relationships are as illustrated in the drawings. Overlapping explanations will be omitted.

Solar Cell

As illustrated in FIG. 1, a solar cell 2 in accordance with this embodiment is a thin-film solar cell comprising a soda-lime glass sheet 4, a rear electrode layer 6 formed on the soda-lime glass sheet 4, a p-type photo-absorbing layer 8 (p-type semiconductor layer) formed on the rear electrode layer 6, an n-type buffer layer 10 (n-type semiconductor layer) formed on the p-type photo-absorbing layer 8, a semi-insulating layer 12 formed on the n-type buffer layer 10, a window layer 14 (transparent conductive layer) formed on the semi-insulating layer 12, and an upper electrode 16 (lead electrode) formed on the window layer 14.

Preferably, the p-type photo-absorbing layer 8 contains Ib, Mb, and VIb group elements. Among Ib group elements such as Cu, Ag, and Au, Cu is used preferably in this embodiment. Among IIIb group elements such as B, Al, Ga, In, and Tl, In and Ga are used preferably. Among VI group elements such as O, S, Se, and Te, Se is used preferably.

Employing Cu as a Ib group element, In and Ga as IIIb group elements, and Se as a VI group element makes it possible for the p-type photo-absorbing layer 8 to become the p-CIGS layer.

Adjusting the molar ratio between In and Ga in the p-CIGS layer can regulate its band gap Eg within the range of 1.0 to 1.6 eV and make its photo-absorption coefficient greater than $10^5$ cm$^{-1}$. A solar cell comprising such a p-CIGS layer can achieve a high conversion efficiency.

In the following, a case where the p-type photo-absorbing layer 8 is a p-CIGS layer will be explained.

The n-type buffer layer 10 is constituted by a compound expressed by the following chemical formula (1):

$$ZnO_{1-x-y}S_xSe_y \quad (1)$$

In chemical formula (1), $x \geq 0$, $y > 0$, and $0.2 < x+y < 0.65$. That is, the n-type buffer layer 10 in this embodiment is a mixed crystal in which ZnO, ZnS, and ZnSe are mixed at a molar ratio of $(1-x-y):x:y$.

By constructing the n-type buffer layer 10 from the compound expressed by the above-mentioned chemical formula (1), this embodiment can optimize the CBM offset as will be explained in the following.

Figure 2:
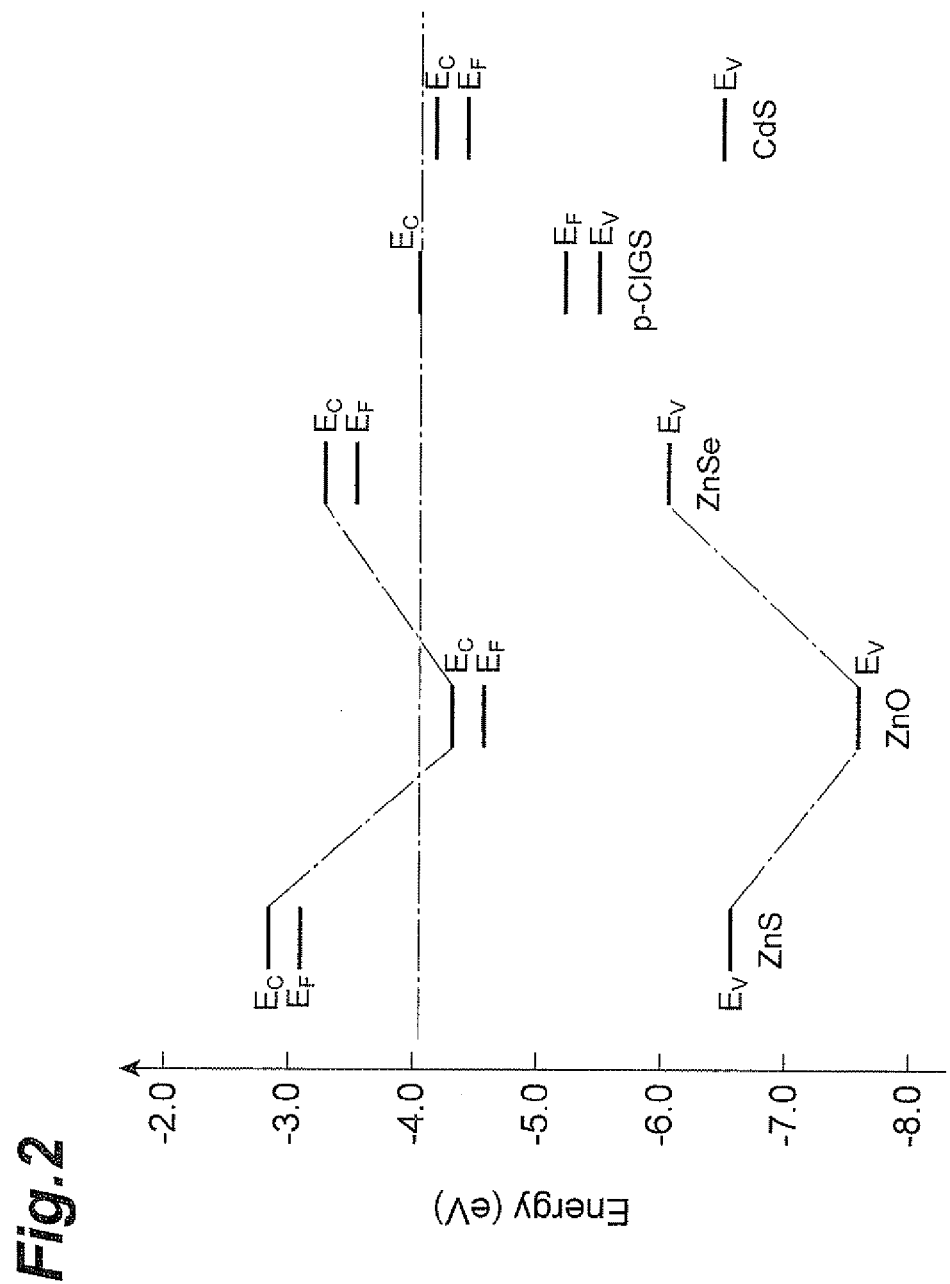
FIG. 2 is a schematic chart illustrating respective band structures of ZnS, ZnO, ZnSe, p-CIGS, and CdS.

As illustrated in FIG. 2, each of ZnS and ZnSe has a CBM ($E_C$) higher than that of p-CIGS. On the other hand, ZnO has a CBM lower than that of p-CIGS. Therefore, in the compound expressed by $ZnO_{1-x-y}S_xSe_y$, adjusting the ratio $(x+y)$ by which O is substituted by S and Se within the range from more than 0.2 to less than 0.65 can make it possible to control the CBM of $ZnO_{1-x-y}S_xSe_y$ freely between that of any of ZnS and ZnSe and that of ZnO. Hence, even when the Eg of the p-CIGS layer 8 is wide-gapped to about 1.4 to 1.5 eV, such a band alignment as to optimize the CBM offset of the p-CIGS layer 8 and n-type buffer layer 10 is achieved. For example, this embodiment can make the CBM offset $\Delta E_c$ positive as illustrated in FIG. 3A and adjust it to an optimal value of 0 to about +0.4 eV. Optimizing the CBM offset $\Delta E_c$ inhibits a number of carriers from recombining through the defect levels $E_d$ of the p-n junction interface and makes it harder for the CBM offset $\Delta E_c$ to become a barrier for photogenerated carriers. As a result, this embodiment can increase the open-circuit voltage, short-circuit current, and fill factor (F.F.), thereby enhancing the conversion efficiency.

When x+y is too small, the open-circuit voltage, short-circuit current, and fill factor (F.F.) tend to decrease, thereby lowering the conversion efficiency. When x+y is too large, the open-circuit voltage, short-circuit current, and fill factor (F.F.) tend to decrease, thereby lowering the conversion efficiency. This embodiment can suppress these tendencies, since $0.2 < x+y < 0.65$.

Method of Manufacturing Solar Cell

First, in this embodiment, the rear electrode layer 6 is formed on the soda-lime glass sheet 4. The rear electrode layer 6 is typically a metal layer constituted by Mo. An example of the method for forming the rear electrode layer 6 is sputtering with an Mo target.

After forming the rear electrode layer 6 on the soda-lime glass sheet 4, the p-CIGS layer 8 is formed on the rear electrode layer 6. Examples of the method for forming the p-CIGS layer 8 include one-step co-evaporation (one-step method), three-stage co-evaporation (NREL method), solid-phase selenization, and vapor-phase selenization.

After forming the p-CIGS layer 8, the n-type buffer layer 10 is formed thereon. Examples of the method for forming the n-type buffer layer include first to third methods as will be explained hereinafter.

The first method forms the n-type buffer layer 10 on the p-CIGS layer 8 by vapor deposition in an atmosphere containing oxygen. A specific example of the first method places a multilayer body (hereinafter referred to as "substrate") comprising the soda-lime glass sheet 4, rear electrode layer 6, and p-CIGS layer 8 in a vapor deposition apparatus, and irradiates a ZnS pellet and a ZnSe pellet with respective electron beams within the apparatus while supplying oxygen into the apparatus, so that thus generated vapors of ZnS and ZnSe are deposited on the surface of the p-CIGS layer together with oxygen. This forms the n-type buffer layer 1. The first method may separately vaporize a pellet constituted by elemental S and a pellet constituted by elemental Se.

By adjusting the amount of an oxygen gas supplied into the vapor deposition apparatus or the amount of deposition of each pellet, the first method can appropriately control the composition of the n-type buffer layer 10 within the range expressed by the above-mentioned chemical formula (1).

In the first method, the temperature of the substrate is preferably 100 to 400° C., more preferably 200 to 300° C. When the substrate temperature is too low, the n-type buffer layer is easier to peel off from the p-CIGS layer 8 and tends to become poor in crystallinity, thereby making it harder to attain favorable solar cell characteristics. When the substrate temperature is too high, on the other hand, the substrate and n-buffer layer are apt to become softer, thereby deforming and melting, while the film-forming speed tends to decrease remarkably. These tendencies can be suppressed when the substrate temperature falls within the range mentioned above.

The second method forms the n-type buffer layer 10 on the p-CIGS layer 8 by sputtering in an atmosphere containing oxygen.

The third method forms a precursor layer containing Zn and Se and having an S content of 0 mol % or greater on the p-type semiconductor layer by sputtering and then heats the precursor layer in an atmosphere containing oxygen. This oxidizes the precursor layer, thereby turning it into the n-type buffer layer 10.

The first method can separately supply ZnS, ZnSe, and an oxygen gas to the substrate and thus is easy to modulate the composition of the n-type buffer layer 10, thereby making it possible to produce a graded layer. Therefore, the first method can achieve a band alignment optimizing the CBM more easily than the third method in which the precursor layer must be heated in an oxygen atmosphere. In the first method, unlike the second and third methods using sputtering, the p-CIGS layer 8 is not damaged by plasmas occurring during sputtering, whereby defect levels are less likely to form at the p-n junction in the solar cell 2.

As with the first method, the second method can separately supply ZnS, ZnSe, and the oxygen gas to the substrate and thus is easy to modulate the composition of the n-type buffer layer.

The third method does not require any mechanism for supplying the oxygen gas to the substrate at the time of sputtering and thus can form the n-type buffer layer with simple equipment. The third method oxidizes the precursor layer obtained after sputtering and thus makes oxygen richer on the surface of the n-type buffer layer than in the first and second methods. Therefore, the third method is suitable when the n-type buffer layer is thin or when attaining a greater molar ratio of oxygen $(1-x-y)$ in the n-type buffer layer 10.

When the n-type buffer layer is formed by the conventional chemical bath deposition, impurities mixed into the p-n junction interface will form defect levels and cause recombination at the defect levels. As compared with the chemical bath deposition, the first to third methods prevent the interface from being contaminated with the impurities and make it easier to control the carrier density. Further, the first to third methods do not require chemical solutions which are essential to the chemical bath deposition, whereby no cost is necessary for purchasing the chemical solutions and disposing of the liquid waste.

Preferred in this embodiment are the first and second methods, in which the most preferred is the first method. The advantageous effects of the present invention become remarkable when the first method is used.

After forming the n-type buffer layer 10, the semi-insulating layer 12 is formed thereon, the window layer 14 is formed on the semi-insulating layer 12, and the upper electrode 16 is formed on the window layer 14. This yields the solar cell 2. An antireflection layer constituted by $MgF_2$ may be formed on the window layer 14.

An example of the semi-insulating layer 12 is a ZnO layer. Examples of the window layer 14 include those made of ZnO:B and ZnO:Al. The upper electrode 16 is constituted by a metal such as Al or Ni, for example. The semi-insulating layer 12, window layer 14, and upper electrode 16 can be formed by sputtering or MOCVD, for example.

Though a preferred embodiment of the present invention is explained in detail in the foregoing, the present invention is not limited to the above-mentioned embodiment.

Advantageous effects similar to those of the above-mentioned embodiment can also be obtained in solar cells equipped with the n-type semiconductor layers 8 constituted by $CuInSe_2$, $CuGaSe_2$, $Cu(In, Ga)(S, Se)_2$, $CuIn_3Se_5$, $CuGa_3Se_5$, $Cu(In, Ga)_3Se_5$, $Cu(In, Ga)_3(S, Se)_5$, $CuAlSe_2$, $Cu(In, Al)Se_2$, $Cu(Ga, Al)Se_2$, $AgInSe_2$, $Ag(In, Ga)Se_2$, and $Cu_2ZnSnS_4$, for example.

The present invention will now be explained more specifically with reference to examples and comparative examples, but should not be restricted to the following examples.

Example 1

After washing and drying a soda-lime glass sheet having a size of 10 cm (length)×10 cm (width)×1 mm (thickness), a film-like rear electrode constituted by elemental Mo was formed thereon by sputtering. The thickness of the rear electrode was 1 μm.

The rear electrode (substrate) formed on the soda-lime glass sheet was placed in a chamber of a sputtering apparatus, and the chamber was vacuumed. While continuously supplying an Ar gas (sputtering gas) into the chamber, sputtering was performed with a target constituted by a Cu—Ga alloy containing 40 at % of Ga and then with a target constituted by metallic In within the chamber in a sputtering step. This sputtering step formed a CuGa alloy layer on the rear electrode, and an In layer on the CuGa alloy layer. This yielded a layer (CuGa—In layer) constructed by the Cu—Ga layer and the In layer formed on the Cu—Ga layer.

In the sputtering step, the Cu—Ga layer had a thickness of 700 nm, while the In layer had a thickness of 300 nm. The temperature of the soda-lime glass sheet and rear electrode was 200° C., while the atmospheric pressure in the chamber was 1 Pa in the sputtering step.

After being formed, the CuGa—In layer was heated for 1 hr in an $H_2Se$ atmosphere at 550° C. in a heat treatment step. This formed a p-type semiconductor layer (p-CIGS layer) having a composition expressed by $CuIn_{0.4}Ga_{0.6}Se_2$ with a thickness of 1 μm.

After forming the p-CIGS layer, the above-mentioned first method (hereinafter referred to as "vapor deposition method") was used, so as to form an n-type buffer layer having a composition listed in Table 1 on the p-CIGS layer.

In the vapor deposition method, the multilayer body (substrate) comprising the soda-lime glass sheet, rear electrode layer, and p-CIGS layer and a ZnSe pellet acting as a source for supplying zinc and selenium were placed in a chamber of a vapor deposition apparatus. Also, as a source for supplying oxygen, an $O_2$ gas pipe was placed near the substrate within the chamber. Then, while keeping the substrate temperature at 300° C. and supplying the substrate with an $O_2$ gas at 40 sccm, the ZnSe pellet was irradiated with an electron beam, so that Zn, Se, and O were deposited on the surface of the p-CIGS layer. This yielded the n-type buffer layer. The thickness of the n-type buffer layer was 100 nm. The molar ratio (1−y)/y of O and Se in the n-type buffer layer was controlled by the amount of supply of the $O_2$ gas.

After forming the n-type buffer layer, an i-ZnO layer (semi-insulating layer) having a thickness of 50 nm was formed thereon. A ZnO:Al layer (window layer) having a thickness of 1 μm was formed on the i-ZnO layer. A current collecting electrode (upper electrode), constituted by Al, having a thickness of 500 nm was formed on the ZnO:Al layer. The i-ZnO layer, ZnO:Al layer, and current collecting electrode were each formed by sputtering. The thin-film solar cell of Example 1 was thus obtained.

Example 2

The thin-film solar cell of Example 2 was obtained by the same method as that of Example 1 except that an n-type buffer layer having a composition listed in Table 1 was formed by the above-mentioned second method (hereinafter referred to as "sputtering method") instead of the vapor deposition method.

In the sputtering method, the substrate and a ZnSe target acting as a source for supplying zinc and selenium were placed in a chamber of a sputtering apparatus. Also, as a source for supplying oxygen, an $O_2$ gas pipe was placed near the substrate within the chamber. Then, while keeping the substrate temperature at 300° C. and supplying the substrate with an Ar gas at 50 sccm and an $O_2$ gas at 40 sccm, the n-type buffer layer was formed on the p-CIGS layer by RF magnetron sputtering with a high frequency power. The thickness of the n-type buffer layer was 100 nm. The molar ratio (1−y)/y of O and Se in the n-type buffer layer was controlled by the amount of supply of the $O_2$ gas.

Example 3

The thin-film solar cell of Example 3 was obtained by the same method as that of Example 1 except that an n-type buffer layer having a composition listed in Table 1 was formed by the above-mentioned third method (hereinafter referred to as "oxidizing method") instead of the vapor deposition method.

In the oxidizing method, the substrate and a ZnSe target acting as a source for supplying zinc and selenium were placed in a chamber of a sputtering apparatus. Then, while keeping the substrate temperature at 200° C. and supplying the substrate with an Ar gas at 50 seem, a precursor layer (constituted by ZnSe) for the n-type buffer layer was formed on the p-CIGS layer by RF magnetron sputtering with a high frequency power. The thickness of the precursor layer for the n-type buffer layer was 100 nm.

The substrate formed with the precursor layer for the n-type buffer layer was transferred into a heat treatment furnace and heat-treated therein for 30 min while supplying the Ar gas and an $O_2$ gas into the furnace. This yielded the n-type buffer layer. The flow ratio $O_2/Ar$ of the $O_2$ and Ar gases supplied into the heat treatment furnace was 0.3, while the heat treatment temperature was 400° C. The molar ratio (1−y)/y of O and Se in the n-type buffer layer was controlled by the flow ratio $O_2/Ar$.

Example 4

The thin-film solar cell of Example 4 was obtained by the same method as that of Example 1 except that an n-type buffer layer having a composition listed in Table 1 was formed by supplying the substrate with the $O_2$ gas at 15 sccm in the vapor deposition method.

Example 5

The thin-film solar cell of Example 5 was obtained by the same method as that of Example 1 except that a layer constituted by $Cu_2ZnSnS_4$ was formed as the p-type semiconductor layer instead of the p-CIGS layer.

For forming the $Cu_2ZnSnS_4$ layer, the rear electrode formed on the soda-lime glass sheet, a $Cu_2S$ target, a ZnS target, and an $SnS_2$ target were placed in a chamber of a sputtering apparatus. Then, ternary simultaneous RF magnetron sputtering with the targets was performed in an Ar atmosphere. This formed a layer (hereinafter referred to as "Cu—

Zn—Sn—S layer") containing Cu, Zn, Sn, and S with a thickness of 1 μm on the rear electrode. The temperature of the rear electrode during sputtering was 300° C. After the sputtering, the Cu—Zn—Sn—S layer was heat-treated for 1 hr in an H$_2$S atmosphere. The heat treatment temperature was 550° C. This formed a p-type semiconductor layer constituted by Cu$_2$ZnSnS$_4$.

Example 6

The thin-film solar cell of Example 6 was obtained by the same method as that of Example 1 except that an n-type buffer layer having a composition listed in Table 1 was formed by using a ZnS pellet in addition to the ZnSe pellet in the vapor deposition method.

Comparative Example 1

The thin-film solar cell of Comparative Example 1 was obtained by the same method as that of Example 1 except that an n-type buffer layer having a composition listed in Table 1 was formed by supplying the substrate with the O$_2$ gas at 10 sccm in the vapor deposition method.

Comparative Example 2

The thin-film solar cell of Comparative Example 2 was obtained by the same method as that of Example 1 except that an n-type buffer layer having a composition listed in Table 1 was formed by supplying the substrate with the O$_2$ gas at 55 sccm in the vapor deposition method.

Comparative Example 3

The thin-film solar cell of Comparative Example 3 was obtained by the same method as that of Example 1 except that a layer constituted by CdS was formed as the n-type buffer layer instead of the layer constituted by ZnO$_{1-x-y}$S$_x$Se$_y$. The layer constituted by CdS was formed by the chemical bath deposition. The thickness of the layer constituted by CdS was 50 nm.

Comparative Example 4

The thin-film solar cell of Comparative Example 4 was obtained by the same method as that of Example 5 except that a layer constituted by CdS was formed as the n-type buffer layer instead of the layer constituted by ZnO$_{1-x-y}$S$_x$Se$_y$. The layer constituted by CdS was formed by the chemical bath deposition. The thickness of the layer constituted by CdS was 50 nm.

Evaluation of Thin-Film Solar Cells

The open-circuit voltage, short-circuit current, fill factor (F.F.), and conversion efficiency were determined in each of the solar cells of Examples 1 to 6 and Comparative Examples 1 to 4. Table 1 lists the results.

TABLE 1

| | p-type light absorbing layer | n-type buffer layer | | | | Open-circuit voltage | Short-circuit current | | Conversion efficiency |
|---|---|---|---|---|---|---|---|---|---|
| | | Formula | x | y | Forming method | (V) | (mA/cm$^2$) | F.F. | (%) |
| Example 1 | Cu(InGa)Se$_2$ | ZnO$_{1-y}$S$_x$Se$_y$ | 0 | 0.3 | vapor deposition | 0.70 | 29.8 | 0.70 | 14.60 |
| Example 2 | Cu(InGa)Se$_2$ | ZnO$_{1-y}$S$_x$Se$_y$ | 0 | 0.3 | sputtering | 0.68 | 27.2 | 0.68 | 12.58 |
| Example 3 | Cu(InGa)Se$_2$ | ZnO$_{1-y}$S$_x$Se$_y$ | 0 | 0.3 | oxidizing | 0.64 | 27.5 | 0.68 | 11.97 |
| Example 4 | Cu(InGa)Se$_2$ | ZnO$_{1-y}$S$_x$Se$_y$ | 0 | 0.6 | vapor deposition | 0.70 | 28.5 | 0.68 | 13.57 |
| Example 5 | Cu$_2$ZnSnS$_4$ | ZnO$_{1-y}$S$_x$Se$_y$ | 0 | 0.3 | vapor deposition | 0.68 | 12.1 | 0.65 | 5.35 |
| Example 6 | Cu(InGa)Se$_2$ | ZnO$_{1-y}$S$_x$Se$_y$ | 0.15 | 0.15 | vapor deposition | 0.71 | 28.3 | 0.71 | 14.27 |
| Comparative Example 1 | Cu(InGa)Se$_2$ | ZnO$_{1-y}$S$_x$Se$_y$ | 0 | 0.7 | vapor deposition | 0.53 | 19.2 | 0.59 | 6.00 |
| Comparative Example 2 | Cu(InGa)Se$_2$ | ZnO$_{1-y}$S$_x$Se$_y$ | 0 | 0.1 | vapor deposition | 0.44 | 20.3 | 0.55 | 4.91 |
| Comparative Example 3 | Cu(InGa)Se$_2$ | CdS | — | — | CBD | 0.58 | 26.3 | 0.65 | 9.92 |
| Comparative Example 4 | Cu$_2$ZnSnS$_4$ | CdS | — | — | CBD | 0.55 | 10.6 | 0.60 | 3.50 |

Examples 1 to 4 and 6 each comprising a p-CIGS layer and an n-type buffer layer constituted by a compound expressed by the following chemical formula (1) were seen to exhibit the open-circuit voltage, short-circuit current, fill factor (F.F.), and conversion efficiency greater than those of Comparative Examples 1 to 3 each comprising the p-CIGS layer and an n-type buffer layer having a composition on the outside of the composition expressed by the following chemical formula (1):

$$ZnO_{1-x-y}S_xSe_y \qquad (1)$$

where x≥0, y>0, and 0.2<x+y<0.65.

The solar cell of Example 5 comprising a Cu$_2$ZnSnS$_4$ layer and an n-type buffer layer constituted by a compound expressed by the above-mentioned chemical formula (1) was seen to exhibit the open-circuit voltage, short-circuit current, fill factor (F.F.), and conversion efficiency greater than those of the solar cell of Comparative Example 4 comprising the Cu$_2$ZnSnS$_4$ layer and an n-type buffer layer constituted by CdS.

REFERENCE SIGNS LIST

2 . . . solar cell; 4 . . . soda-lime glass sheet; 6 . . . rear electrode layer; 8 . . . p-type semiconductor layer (p-CIGS layer); 10 . . . n-type semiconductor layer (n-type buffer layer); 12 . . . semi-insulating layer; 14 . . . window layer (transparent conductive layer); 16 . . . upper electrode (lead electrode); E$_C$ . . . energy level in the bottom part of the conduction band; E$_F$ . . . Fermi level; E$_V$ . . . energy level in the uppermost part of the conduction band; ΔE$_C$ . . . CBM offset; E$_d$ . . . defect level

What is claimed is:

1. A solar cell comprising:
   a p-type semiconductor layer containing $Cu(In_{1-a}, Ga_a)Se_2$, where $0.5 \leq a \leq 0.8$; and
   an n-type semiconductor layer, formed on the p-type semiconductor layer, containing a compound expressed by the following chemical formula (1):

$$ZnO_{1-x-y}S_xSe_y \tag{1}$$

where $x>0$, $y>0$, and $0.2<x+y<0.65$,
   wherein
   a CBM offset between the p-type semiconductor layer and the n-type semiconductor layer ranges from 0 to +0.4 eV.

2. A method of manufacturing a solar cell, the method comprising the steps of:
   forming a p-type semiconductor layer containing $Cu(In_{1-a}, Ga_a)Se_2$, where $0.5 \leq a \leq 0.8$; and
   forming an n-type semiconductor layer containing a compound expressed by the following chemical formula (1) on the p-type semiconductor layer by vapor deposition in an atmosphere containing oxygen:

$$ZnO_{1-x-y}S_xSe_y \tag{1}$$

where $x>0$, $y>0$, and $0.2<x+y<0.65$,
   wherein
   a CBM offset between the p-type semiconductor layer and the n-type semiconductor layer ranges from 0 to +0.4 eV.

3. A method of manufacturing a solar cell, the method comprising the steps of:
   forming a p-type semiconductor layer containing $Cu(In_{1-a}, Ga_a)Se_2$, where $0.5 \leq a \leq 0.8$; and
   forming an n-type semiconductor layer containing a compound expressed by the following chemical formula (1) on the p-type semiconductor layer by sputtering in an atmosphere containing oxygen:

$$ZnO_{1-x-y}S_xSe_y \tag{1}$$

where $x>0$, $y>0$, and $0.2<x+y<0.65$,
   wherein
   a CBM offset between the p-type semiconductor layer and the n-type semiconductor layer ranges from 0 to +0.4 eV.

4. A method of manufacturing a solar cell, the method comprising the steps of:
   forming a p-type semiconductor layer containing $Cu(In_{1-a}, Ga_a)Se_2$ where $0.5 \leq a \leq 0.8$;
   forming a precursor layer containing Zn and Se and having an S content of 0 mol% or greater on the p-type semiconductor layer by sputtering; and
   heating the precursor layer in an atmosphere containing oxygen, so as to form an n-type semiconductor layer containing a compound expressed by the following chemical formula (1) on the p-type semiconductor layer:

$$ZnO_{1-x-y}S_xSe_y \tag{1}$$

where $x>0$, $y>0$, and $0.2<x+y<0.65$,
   wherein
   a CBM offset between the p-type semiconductor layer and the n-type semiconductor layer ranges from 0 to +0.4 eV.

5. The solar cell according to claim 1, wherein the n-type semiconductor layer is a graded layer having a chemical composition that is modulated gradually.

* * * * *